United States Patent
Jain

(10) Patent No.: US 8,580,663 B2
(45) Date of Patent: Nov. 12, 2013

(54) FORMATION OF SHALLOW JUNCTIONS BY DIFFUSION FROM A DIELECTRONIC DOPED BY CLUSTER OR MOLECULAR ION BEAMS

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 208 days.

(21) Appl. No.: 13/217,577

(22) Filed: Aug. 25, 2011

(65) Prior Publication Data

US 2011/0312168 A1    Dec. 22, 2011

Related U.S. Application Data

(63) Continuation of application No. 12/190,337, filed on Aug. 12, 2008, now Pat. No. 8,026,135.

(60) Provisional application No. 60/955,963, filed on Aug. 15, 2007.

(51) Int. Cl.
*H01L 21/426* (2006.01)

(52) U.S. Cl.
USPC .......................................... 438/530; 438/301

(58) Field of Classification Search
USPC ........................................................ 438/530
See application file for complete search history.

(56) References Cited

U.S. PATENT DOCUMENTS

| | | | |
|---|---|---|---|
| 4,717,684 A | 1/1988 | Katto et al. | |
| 5,352,631 A | 10/1994 | Sitaram et al. | |
| 5,399,506 A | 3/1995 | Tsukamoto | |
| 5,496,750 A | 3/1996 | Moslehi | |
| 5,648,288 A | 7/1997 | Williams et al. | |
| 6,214,682 B1 | 4/2001 | Wang | |
| 2008/0122005 A1* | 5/2008 | Horsky et al. | 438/224 |

* cited by examiner

*Primary Examiner* — Zandra Smith
*Assistant Examiner* — Toniae Thomas
(74) *Attorney, Agent, or Firm* — Jacqueline J. Garner; Wade J. Brady, III; Frederick J. Telecky, Jr.

(57) ABSTRACT

A process for forming diffused region less than 20 nanometers deep with an average doping dose above $10^{14}$ cm$^{-2}$ in an IC substrate, particularly LDD region in an MOS transistor, is disclosed. Dopants are implanted into a source dielectric layer using gas cluster ion beam (GCIB) implantation, molecular ion implantation or atomic ion implantation resulting in negligible damage in the IC substrate. A spike anneal or a laser anneal diffuses the implanted dopants into the IC substrate. The inventive process may also be applied to forming source and drain (S/D) regions. One source dielectric layer may be used for forming both NLDD and PLDD regions.

13 Claims, 7 Drawing Sheets

FORMATION OF SHALLOW JUNCTIONS BY DIFFUSION FROM A DIELECTRONIC DOPED BY CLUSTER OR MOLECULAR ION BEAMS

CROSS-REFERENCE TO RELATED APPLICATIONS

This application is a continuation of pending application Ser. No. 12/190,337, filed Aug. 12, 2008 which is a non-provisional of Application No. 60/955,963, filed Aug. 15, 2007 all of which are incorporated herein by reference.

FIELD OF THE INVENTION

This invention relates to the field of integrated circuits. More particularly, this invention relates to methods to form shallow junctions in integrated circuits.

BACKGROUND OF THE INVENTION

It is well known that transistors in advanced integrated circuits (ICs) are shrinking with each new fabrication technology node, as articulated by Moore's Law. For example, at the 32 nanometer technology node, it is desired to form doped regions in transistors such as source and drain extensions which are less than 10 nanometers deep with average doping densities above $10^{21}$ cm$^{-3}$. Formation of heavily doped shallow regions is problematic because anneals sufficient to repair damage to the IC substrate cause dopants to diffuse deeper than desired.

SUMMARY OF THE INVENTION

This Summary is provided to comply with 37 C.F.R.§1.73, requiring a summary of the invention briefly indicating the nature and substance of the invention. It is submitted with the understanding that it will not be used to interpret or limit the scope or meaning of the claims.

The instant invention provides a process for forming diffused regions in an integrated circuit (IC) less than 20 nanometers deep with an average doping dose above $10^{14}$ cm$^{-2}$, in particular lightly doped drain (LDD) regions in metal oxide semiconductor (MOS) transistors. A source dielectric layer is formed on an existing surface of the IC. Dopants are implanted into the source dielectric layer in a region above the region of the IC to be doped, using gas cluster ion beam (GCIB) implantation, molecular ion implantation or atomic ion implantation. The majority of the dopants are deposited in the source dielectric layer, so that negligible damage is generated in the IC substrate. A rapid thermal drive process such as a spike anneal or a laser anneal diffuses the implanted dopants into the IC substrate to attain a desired depth and average doping density in the doped region. The inventive process may also be applied to forming source and drain (S/D) regions in p-channel metal oxide semiconductor (PMOS) and n-channel metal oxide semiconductor (NMOS) transistors. One source dielectric layer may be used for forming both NLDD and PLDD regions. Similarly, one source dielectric layer may be used for forming both NSD and PSD regions.

DETAILED DESCRIPTION

Figure 1A:
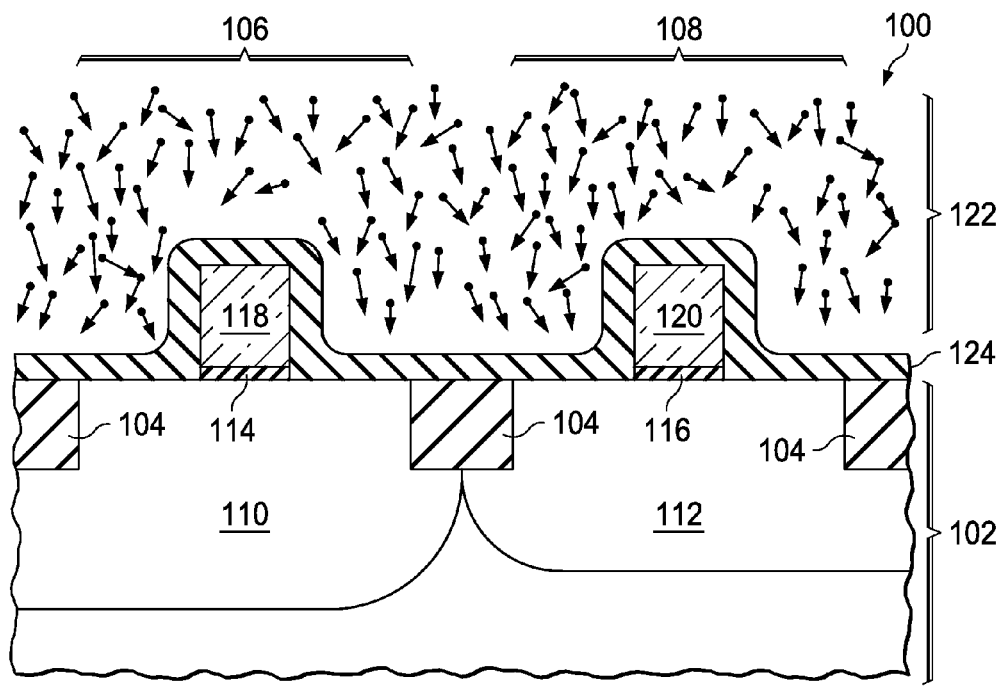
FIG. 1A through FIG. 1F are cross-sections of an IC depicting formation of PMOS LDD regions and NMOS LDD regions according to an embodiment of the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a process for forming a doped region in an integrated circuit (IC) less than 20 nanometers deep with an average doping dose above $10^{14}$ cm$^{-2}$. A source dielectric layer is formed on an existing surface of the IC. Dopants are implanted into the source dielectric layer in a region above the region of the IC to be doped, using gas cluster ion beam (GCIB) implantation, molecular ion implantation or atomic ion implantation. The majority of the dopants are deposited in the source dielectric layer, so that negligible damage is generated in the IC substrate. A thermal drive process diffuses the implanted dopants into the IC substrate to attain a desired depth and average doping density in the doped region. The inventive process may be applied to forming lightly doped drain (LDD) regions in both p-channel metal oxide semiconductor (PMOS) transistors and n-channel metal oxide semiconductor (NMOS) transistors, and to forming source and drain (S/D) regions in PMOS and NMOS transistors.

FIG. 1A through FIG. 1F are cross-sections of an IC depicting formation of PMOS LDD regions and NMOS LDD regions according to an embodiment of the instant invention, depicted in successive stages of fabrication. Referring to FIG. 1A, the IC (100) is formed in a substrate (102) which is commonly a single crystal silicon wafer, but may be a silicon wafer with a silicon germanium epitaxial layer, a silicon-on-insulator (SOI) wafer, a hybrid orientation technology (HOT) wafer with regions of different crystal orientations, or other material appropriate for fabrication of the IC (100). Elements of field oxide (104) are formed by a shallow trench isolation (STI) process sequence, in which trenches, commonly 200 to 500 nanometers deep, are etched into the IC (100), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as a high aspect ratio process (HARP). An element of field oxide (104) separates an area in the substrate (102) defined for an NMOS transistor (106) from an area in the substrate (102) defined for a PMOS transistor (108). A p-type well (110), commonly called a p-well, is formed in the substrate (102), typically by ion implanting a p-well set of p-type dopants, including boron and possibly gallium and/or indium, at doses from $1 \cdot 10^{11}$ to $1 \cdot 10^{14}$ atoms/cm², into the NMOS transistor area (106). A p-well photoresist pattern, not shown in FIG. 1A for clarity, is commonly used to block the p-well set of p-type dopants from regions outside the p-well (110). The p-well (110) extends from a top surface of the substrate (102) to a depth typically 50 to 500 nanometers below a bottom surface of the field oxide elements (104). The ion implantation process to form the p-well (110) may include additional steps to implant additional p-type dopants at shallower depths for purposes of improving NMOS transistor performance, such as threshold adjustment, leakage current reduction and suppression of parasitic bipolar operation. An n-type well (112), commonly called an n-well, is formed in the substrate (102), typically by ion implanting a n-well set of n-type dopants, including phosphorus and arsenic, and possibly antimony, at doses from $1 \cdot 10^{11}$ to $1 \cdot 10^{14}$ atoms/cm², into the PMOS transistor area (108). An n-well photoresist pattern, not shown in FIG. 1A for clarity, is commonly used to block the n-well set of n-type dopants from regions defined for NMOS transistors. The n-well (112) extends from the top surface of the substrate (102) to a depth typically 50 to 500 nanometers below the bottom surface of the field oxide elements (104). The ion implantation process to form the n-well (112) may include additional steps to implant additional n-type dopants at shallower depths for purposes of improving PMOS transistor performance, such as threshold adjustment, leakage current reduction and suppression of parasitic bipolar operation. A sheet resistivity of the n-well (112) is commonly between 100 and 1000 ohms/square.

Continuing to refer to FIG. 1A, an NMOS gate dielectric layer (114), typically silicon dioxide, nitrogen doped silicon dioxide, silicon oxy-nitride, hafnium oxide, layers of silicon dioxide and silicon nitride, or other insulating material, and typically between 1 and 3 nanometers thick, is formed on a top surface of the p-well (110) in the NMOS transistor area (106) using any of a variety of gate dielectric formation process, for example thermal oxidation, plasma nitridation of an oxide layer, and/or dielectric material deposition by atomic layer deposition (ALD) processes. A PMOS gate dielectric layer (116) is formed on a top surface of the n-well (112) in the PMOS transistor area (108) by similar processes and with similar properties as the NMOS gate dielectric layer (114). It is common to form a portion of or all of the NMOS gate dielectric layer (114) and the PMOS gate dielectric layer (116) concurrently. An NMOS gate (118), typically polycrystalline silicon, commonly known as polysilicon, between 50 to 200 nanometers thick, is formed on a top surface of the NMOS gate dielectric layer (114), commonly by depositing a layer of polysilicon on an existing top surface of the IC (100), forming an NMOS gate photoresist pattern on a top surface of the polysilicon layer to define an area for the NMOS gate (118), and removing unwanted polysilicon using reactive ion etching methods. A PMOS gate (120) is formed on a top surface of the PMOS gate dielectric layer (116) by a similar process used to form the NMOS gate (118). It is common to form a portion of or all of the NMOS gate (118) and the PMOS gate (120) concurrently.

Still referring to FIG. 1A, an LDD source dielectric deposition process (122), preferably a rapid thermal chemical vapor deposition (RTCVD) process, but possibly a plasma enhanced chemical vapor deposition (PECVD) process, a CVD process, or an ALD process, is performed on the IC (100) to form a LDD source dielectric layer (124) on an existing top surface of the IC (100). The LDD source dielectric layer (124) is preferably between 5 and 20 nanometers thick and is formed of silicon dioxide and/or silicon nitride. In a first embodiment, the LDD source dielectric deposition process (122) is an isotropic process such that the LDD source dielectric layer (124) is deposited conformally on the top and lateral surfaces of the NMOS gate (118) and the PMOS gate (120). For the purposes of this disclosure, the term "deposited conformally" is understood to mean deposited so that a thickness of a layer which is deposited conformally is substantially the same on lateral surfaces, sloped surfaces and horizontal surfaces.

Figure 1B:
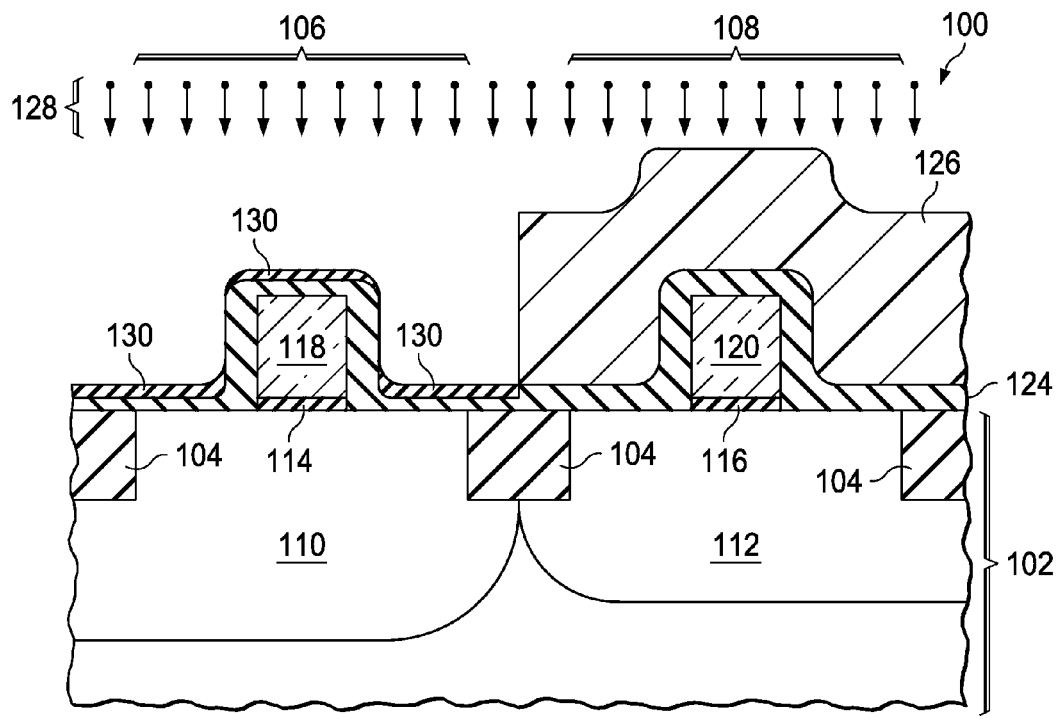

FIG. 1B depicts the IC (100) during an n-type lightly doped drain (NLDD) dopant implantation process. An NLDD photoresist pattern (126) is formed on a top surface of the LDD source dielectric layer (124) such that an area in the NMOS transistor area (106) for implantation of n-type NLDD dopants is exposed. An NLDD set of n-type dopants (128), such as phosphorus and possibly arsenic, is accelerated toward the IC (100), preferably by a gas cluster ion beam (GCIB) process but possibly by a molecular ion implantation process or an atomic ion implantation process, to form an NLDD implanted region (130) with a dose between $10^{14}$ and $10^{16}$ dopant atoms/cm² in a top region of the LDD source dielectric layer (124). In a preferred embodiment, the NLDD dopants (128) are directed straight down into the LDD source dielectric layer (124), so that vertical surfaces of the LDD source dielectric layer (124), for example on lateral surfaces of the NMOS gate (118), receive less than 1 percent of the NLDD dopants (128) per unit area compare to horizontal surfaces of the LDD source dielectric layer (124).

A GCIB process may be performed by pressurizing a gas mixture of a carrier gas, such a helium and/or argon, and a dopant containing gas such as diborane, phosphine or arsine, at a ratio between 90%:10% and 98%:2%, releasing the gas mixture through a 100 to 500 micron diameter nozzle so that the gas mixture condenses into clusters of a few hundred to a few thousand atoms, ionizing the clusters such that each cluster typically has one electron unit of charge, approximately $1.6 \cdot 10^{-19}$ coulomb, and accelerating the clusters toward an IC, commonly at an acceleration energy between 3 and 30 keV. Each cluster typically contains between 10 and 3000 dopant atoms. The clusters break up upon impact with a top surface of a source dielectric layer and dopant atoms in the clusters penetrate the source dielectric layer to a depth of a few nanometers. A majority of the carrier gas atoms in the clusters escape immediately after impact of the clusters. The acceleration energy of each cluster is divided among the atoms in each cluster, so that a very low fraction, much less than 1 percent, of dopant atoms have sufficient energy to penetrate the source dielectric layer and displace a silicon atom in a substrate of the IC. Doses greater than $10^{15}$ atoms/cm² of embedded dopant atoms in the source dielectric layer may be attained in GCIB processes. The GCIB processes desirably provide a method of attaining useful doses without the amount of silicon crystal lattice damage that would be expected in conventional ion implantation processes without source dielectric layers providing equivalent doses. GCIB processes may be performed in commercially available semiconductor processing equipment, for example GCIB tools made by TEL-Epion.

Alternatively, a molecular ion process may be performed by accelerating molecules such as carborane ($C_2B_{10}H_{12}$), phosphorus dimers (P$_2$) or tetramers (P$_4$), or arsenic dimers (As$_2$) or tetramers (As$_4$), containing boron, phosphorus or arsenic dopant atoms, respectively, toward an IC at acceleration energies between 3 and 30 keV. The acceleration energy of each molecule is divided among the atoms in each molecule, so that a low fraction, less than 5 percent, of dopant atoms have sufficient energy to penetrate a source dielectric layer and displace a silicon atom in a substrate of the IC. Doses greater than 10$^{15}$ atoms/cm$^2$ of embedded dopant atoms in the source dielectric layer may be attained in molecular ion implantation processes. The molecular ion implantation processes desirably provide a method of attaining useful doses without the amount of silicon crystal lattice damage that would be expected in conventional ion implantation processes without source dielectric layers providing equivalent doses. Molecular ion implantation processes may be performed in commercially available semiconductor ion implanters.

Alternatively, an atomic ion implantation process may be performed by accelerating individual dopant atoms such as boron, phosphorus or arsenic toward an IC at acceleration energies between 2 and 10 keV. In a preferred embodiment, over 90 percent of the dopant atoms are absorbed in a source dielectric layer, so that less than 10 percent of the dopant atoms impact a single crystal silicon substrate below the source dielectric layer, desirably reducing an amount of silicon crystal lattice damage that would be expected in conventional ion implantation processes without source dielectric layers providing equivalent doses. Atomic ion implantation processes may be performed in commercially available semiconductor ion implanters.

Referring to FIG. 1B, the NLDD photoresist pattern (126) is removed, commonly by exposing the IC (100) to an oxygen containing plasma, followed by a wet cleanup to remove any organic residue from the top surface of the LDD source dielectric layer (124).

Figure 1C:
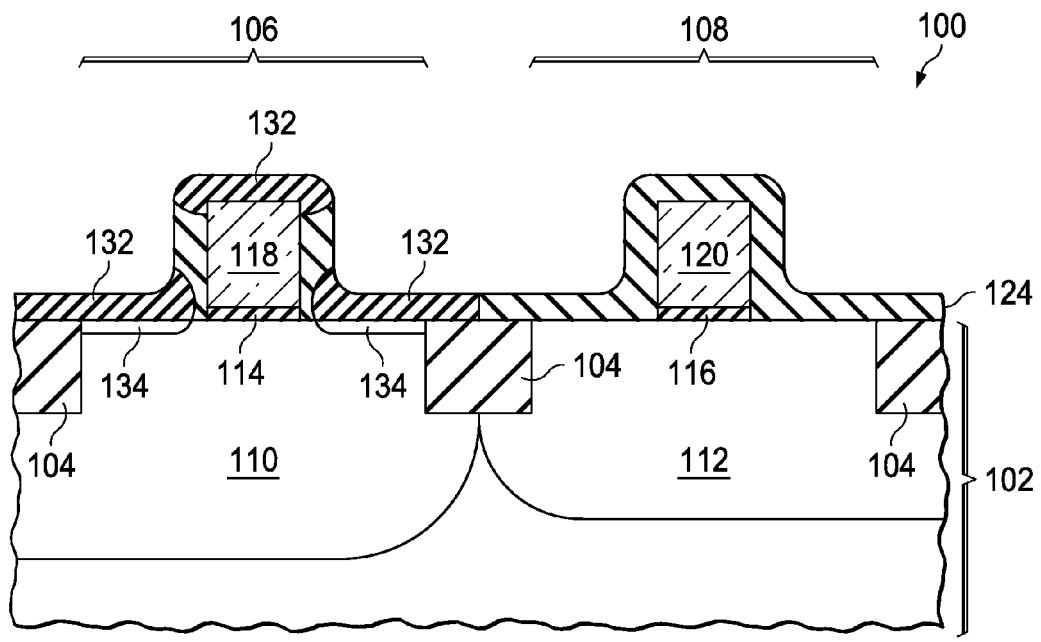

FIG. 1C depicts the IC (100) after an NLDD drive process which heats an existing top region of the IC (100) causing the implanted NLDD dopant atoms in the NLDD implanted region in the top region of the LDD source dielectric layer (124) to diffuse through the LDD source dielectric layer (124) to form an NLDD infused region (132) in the LDD source dielectric layer (124) over horizontal surfaces of the p-well (110) and NMOS gate (118). During the NLDD drive process, NLDD dopant atoms diffuse out of the NLDD infused region (132) into the top region of the p-well (110) to form NLDD diffused regions (134) at the top surface of the p-well (110) adjacent to the NMOS gate (118) in the NMOS transistor area (106). The NLDD drive process is preferably a spike anneal process which heats the top surface of the IC (100) to a temperature between 900 C and 1100 C for 1 to 5 seconds, or a laser anneal process which heats the top surface of the IC (100) to a temperature between 1175 C and 1300 C for 100 microseconds to 2 milliseconds. In a preferred embodiment, the NLDD diffused regions (134) are between 10 and 20 nanometers deep and contain between 10$^{14}$ and 10$^{16}$ NLDD dopant atoms/cm$^2$. It is within the scope of the instant invention to perform the NLDD drive process with any thermal profile in any ambient which produces a desired depth and dopant concentration of the NLDD diffused regions (134).

Figure 1D:
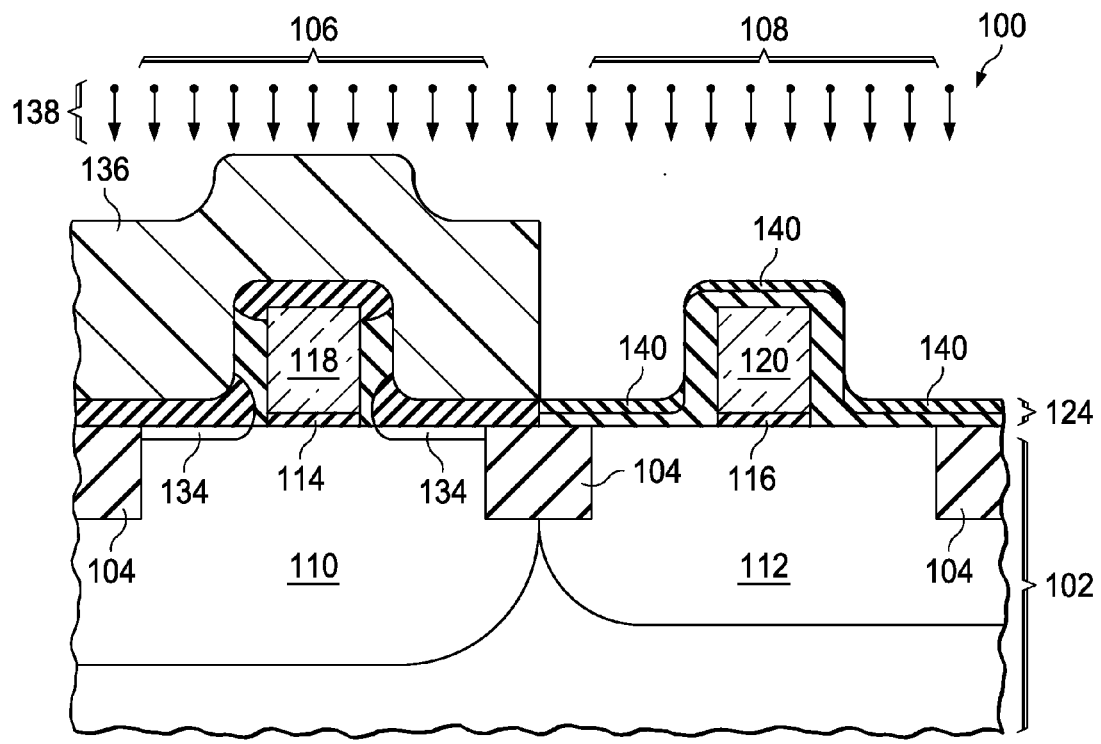

FIG. 1D depicts the IC (100) during a p-type lightly doped drain (PLDD) dopant implantation process. In one embodiment, the source dielectric layer used in the NLDD formation process described in reference to FIG. 1A through FIG. 1C may be removed and a new source dielectric layer formed on the IC (100). In another embodiment, depicted herein, the source dielectric layer used in the NLDD formation process is reused during PLDD formation. A PLDD photoresist pattern (136) is formed on a top surface of the LDD source dielectric layer (124) such that an area in the PMOS transistor area (108) for implantation of p-type PLDD dopants is exposed. A PLDD set of p-type dopants (138), such as boron, is accelerated toward the IC (100), preferably by a GCIB process but possibly by a molecular ion implantation process or an atomic ion implantation process, to form a PLDD implanted region (140) with a dose between 10$^{14}$ and 10$^{16}$ dopant atoms/cm$^2$ in a top region of the LDD source dielectric layer (124). In a preferred embodiment, the PLDD dopants (138) are directed straight down into the LDD source dielectric layer (124), so that vertical surfaces of the LDD source dielectric layer (124), for example on lateral surfaces of the PMOS gate (120), receive less than 1 percent of the PLDD dopants (138) per unit area compare to horizontal surfaces of the LDD source dielectric layer (124). The PLDD photoresist pattern (136) is removed, commonly by exposing the IC (100) to an oxygen containing plasma, followed by a wet cleanup to remove any organic residue from the top surface of the LDD source dielectric layer (124).

Figure 1E:
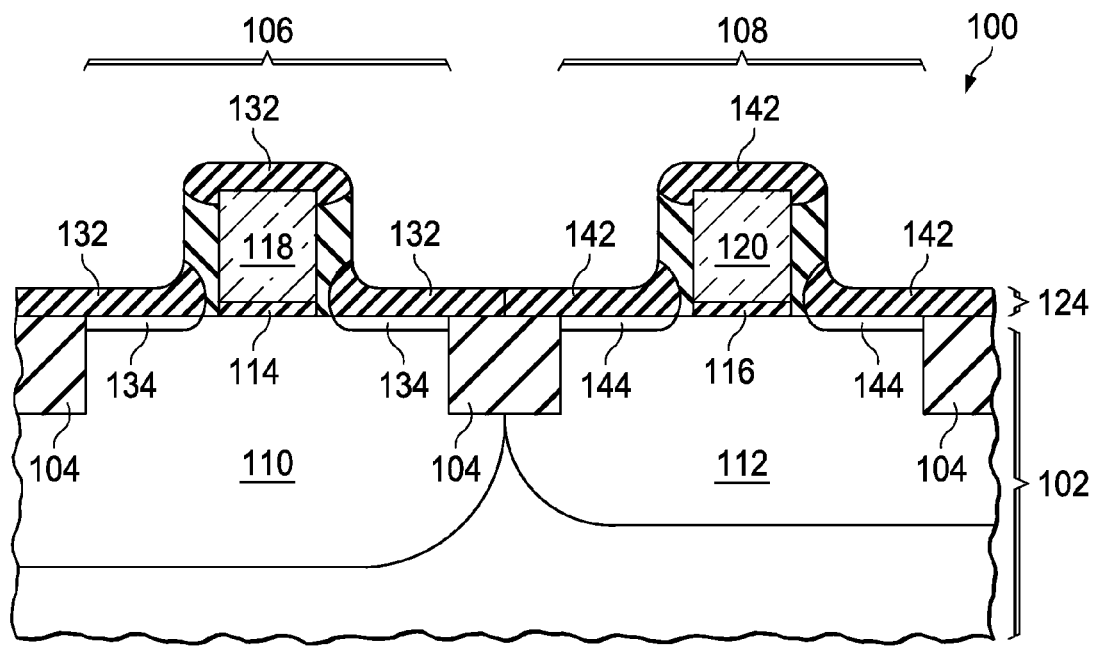

FIG. 1E depicts the IC (100) after a PLDD drive process, similar to the NLDD drive process, which heats an existing top region of the IC (100) causing the implanted PLDD dopant atoms in the PLDD implanted region in the top region of the LDD source dielectric layer (124) to diffuse through the LDD source dielectric layer (124) to form a PLDD infused region (142) in the LDD source dielectric layer (124) over horizontal surfaces of the n-well (112) and PMOS gate (120). During the PLDD drive process, PLDD dopant atoms diffuse out of the PLDD infused region (142) into the top region of the n-well (112) to form PLDD diffused regions (144) at the top surface of the n-well (112) adjacent to the PMOS gate (120) in the PMOS transistor area (108). The PLDD drive process is preferably a spike anneal process which heats the top surface of the IC (100) to a temperature between 900 C and 1100 C for 1 to 5 seconds, or a laser anneal process which heats the top surface of the IC (100) to a temperature between 1175 C and 1300 C for 100 microseconds to 2 milliseconds. In a preferred embodiment, the PLDD diffused regions (144) are between 10 and 20 nanometers deep and contain between 10$^{14}$ and 10$^{16}$ PLDD dopant atoms/cm$^2$. It is within the scope of the instant invention to perform the PLDD drive process with any thermal profile in any ambient which produces a desired depth and dopant concentration of the PLDD diffused regions (144). In an alternate embodiment, the NLDD drive process and the PLDD drive process may be performed concurrently.

Figure 1F:
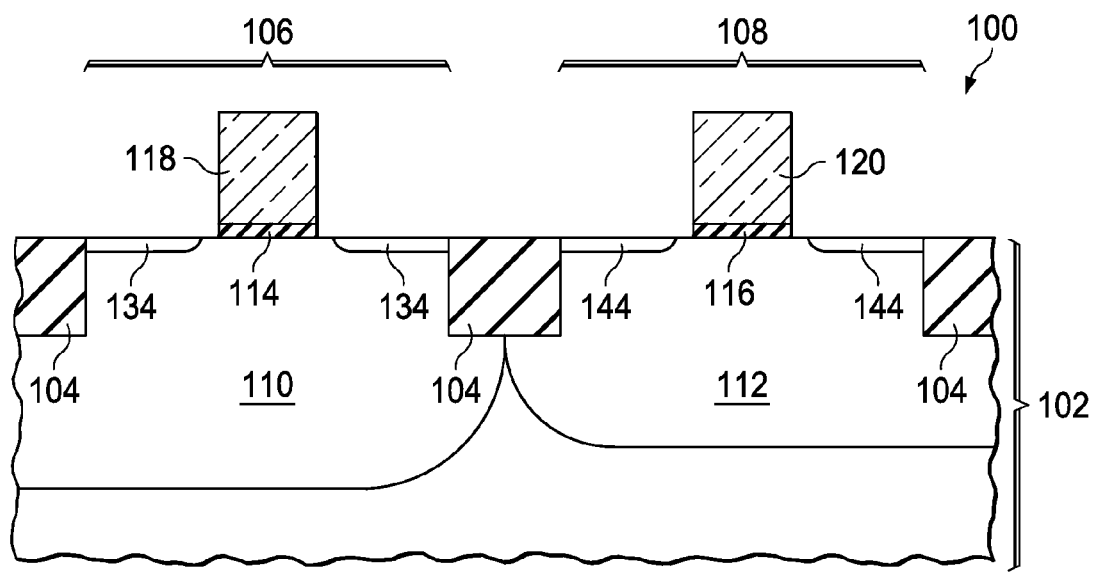

FIG. 1F depicts the IC (100) after an optional source dielectric layer removal process. The source dielectric layer may be removed during subsequent processing, preferably by immersing the IC (100) in a dilute aqueous solution of hydrofluoric acid, possibly buffered with ammonium fluoride.

Although the process described in reference to FIG. 1A through FIG. 1F is directed to formation of LDD regions, it will be recognized by those familiar with IC fabrication that the process for forming a diffused layer using an implanted source dielectric layer may be applied to form another diffused layer at a top surface of an IC substrate.

Figure 2A:
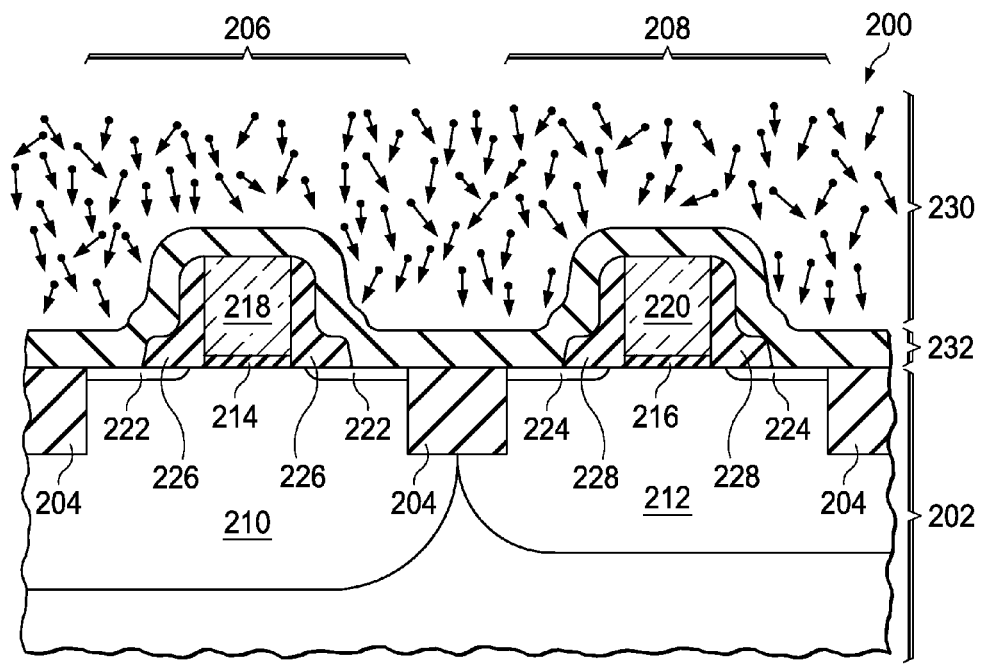
FIG. 2A through FIG. 2E are cross-sections of an IC depicting formation of PSD regions and NSD regions according to an embodiment of the instant invention, depicted in successive stages of fabrication.

FIG. 2A through FIG. 2E are cross-sections of an IC depicting formation of PMOS source and drain (PSD) regions and NMOS source and drain (NSD) regions according to an embodiment of the instant invention, depicted in successive stages of fabrication. Referring to FIG. 2A, the IC (200) is formed in a substrate (202) with the properties described in reference to FIG. 1A. Elements of field oxide (204) are formed in a top region of the substrate (202) by an STI process, such that an element of field oxide (204) separates an area in the substrate (202) defined for an NMOS transistor (206) from an area in the substrate (202) defined for a PMOS transistor (208). A p-well (210) is formed in the substrate (202) in the NMOS area (206), and an n-well (212) is formed in the substrate (202) in the PMOS area (208), as described in reference to FIG. 1A. An NMOS gate dielectric layer (214) is formed on a top surface of the p-well (210), and a PMOS gate dielectric layer (216) is formed on a top surface of the n-well (212), as described in reference to FIG. 1A. An NMOS gate (218) is formed on a top surface of the NMOS gate dielectric layer (214), and a PMOS gate (220) is formed on a top surface of the PMOS gate dielectric layer (216), as described in reference to FIG. 1A.

Continuing to refer to FIG. 2A, an NLDD diffused region (222) is formed in a top region of the p-well (210) adjacent to the NMOS gate (218) as described in reference to FIG. 1A through FIG. 1C. A PLDD diffused region (224) is formed in a top region of the n-well (212) adjacent to the PMOS gate (220) as described in reference to FIG. 1A and FIG. 1D through FIG. 1E. NMOS gate sidewall spacers (226) are formed on lateral surfaces of the NMOS gate (218), typically by deposition of one or more conformal layers of silicon nitride and/or silicon dioxide on a top and lateral surfaces of the NMOS gate (218) and the top surface of the p-well (210), followed by removal of the conformal layer material from the top surface of the NMOS gate (218) and the top surface of the p-well (210) by anisotropic etching methods, leaving the conformal layer material on the lateral surfaces of the NMOS gate (218). PMOS gate sidewall spacers (228) are formed on lateral surfaces of the PMOS gate (220) by a similar process as the NMOS gate sidewall spacers (226). It is common for the NMOS gate sidewall spacers (226) and PMOS gate sidewall spacers (228) to have different thicknesses. Typically, at least a portion of the NMOS gate sidewall spacers (226) and PMOS gate sidewall spacers (228) are formed concurrently.

Still referring to FIG. 2A, a S/D source dielectric deposition process (230) as described in reference to FIG. 1A is performed on the IC (200) to form a S/D source dielectric layer (232) on an existing top surface of the IC (200). The S/D source dielectric layer (232) is preferably between 10 and 30 nanometers thick and is formed of silicon dioxide and/or silicon nitride. In a first embodiment, the S/D source dielectric deposition process (230) is an isotropic process such that the S/D source dielectric layer (232) is deposited conformally on an existing top surface of the IC (200), including the p-well (210), the n-well (212), the NMOS gate (218), the PMOS gate (220), the NMOS gate sidewall spacers (226) and PMOS gate sidewall spacers (228).

Figure 2B:
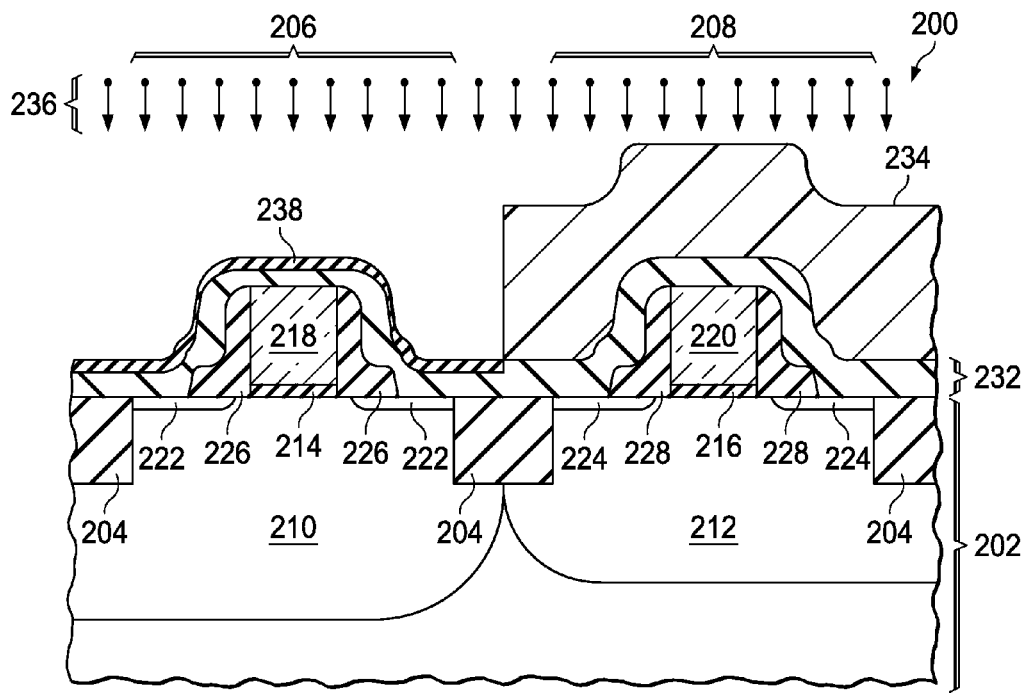

FIG. 2B depicts the IC (200) during an NSD dopant implantation process. An NSD photoresist pattern (234) is formed on a top surface of the S/D source dielectric layer (232) such that an area in the NMOS transistor area (206) for implantation of n-type NSD dopants is exposed. An NSD set of n-type dopants (236), such as phosphorus and possibly arsenic, is accelerated toward the IC (200), preferably by a GCIB process but possibly by a molecular ion implantation process or an atomic ion implantation process, to form an NSD implanted region (238) with a dose between $10^{14}$ and $10^{17}$ dopant atoms/cm$^2$ in a top region of the S/D source dielectric layer (232). The NSD photoresist pattern (234) is removed, commonly by exposing the IC (200) to an oxygen containing plasma, followed by a wet cleanup to remove any organic residue from the top surface of the S/D source dielectric layer (232).

Figure 2C:
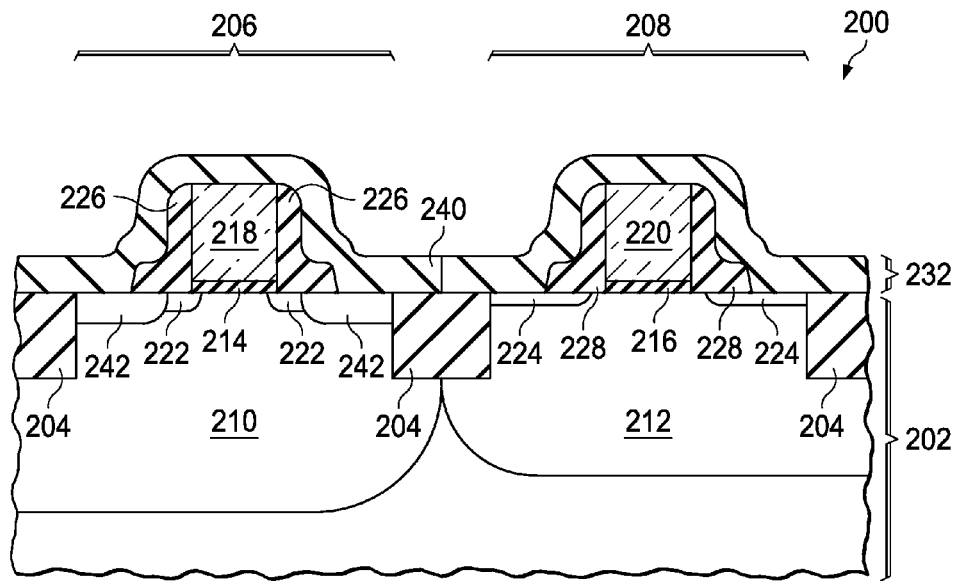

FIG. 2C depicts the IC (200) after an NSD drive process which heats an existing top region of the IC (200) causing the implanted NSD dopant atoms in the NSD implanted region in the top region of the S/D source dielectric layer (232) to diffuse through the S/D source dielectric layer (232) to form an NSD infused region (240) in the S/D source dielectric layer (232) In the NMOS transistor area (206). During the NSD drive process, NSD dopant atoms diffuse out of the NSD infused region (240) into the top region of the p-well (210) to form NSD diffused regions (242) at the top surface of the p-well (210) adjacent to the NMOS gate sidewall spacers (226) in the NMOS transistor area (206). The NSD drive process is preferably a spike anneal process which heats the top surface of the IC (200) to a temperature between 900 C and 1100 C for 1 to 5 seconds, or a laser anneal process which heats the top surface of the IC (200) to a temperature between 1175 C and 1300 C for 100 microseconds to 2 milliseconds. In a preferred embodiment, the NSD diffused regions (242) are between 30 and 100 nanometers deep and contain between $10^{14}$ and $10^{17}$ NSD dopant atoms/cm$^2$. It is within the scope of the instant invention to perform the NSD drive process with any thermal profile in any ambient which produces a desired depth and dopant concentration of the NSD diffused regions (242).

Figure 2D:
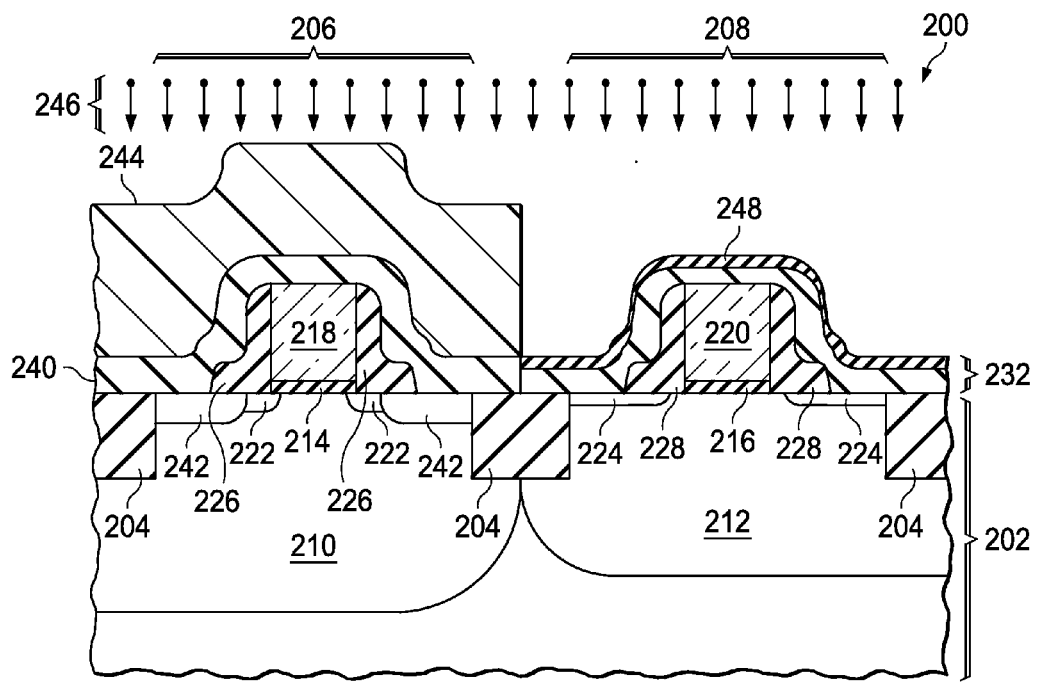

FIG. 2D depicts the IC (200) during a PSD dopant implantation process. In one embodiment, the source dielectric layer used in the NSD formation process described in reference to FIG. 2A through FIG. 2C may be removed and a new source dielectric layer formed on the IC (200). In another embodiment, depicted herein, the source dielectric layer used in the NSD formation process is reused during PSD formation. A PSD photoresist pattern (244) is formed on a top surface of the S/D source dielectric layer (232) such that an area in the PMOS transistor area (208) for implantation of p-type PSD dopants is exposed. A PSD set of p-type dopants (246), such as boron, is accelerated toward the IC (200), preferably by a GCIB process but possibly by a molecular ion implantation process or an atomic ion implantation process, to form a PSD implanted region (248) with a dose between $10^{14}$ and $10^{17}$ dopant atoms/cm$^2$ in a top region of the S/D source dielectric layer (232). The PSD photoresist pattern (244) is removed, commonly by exposing the IC (200) to an oxygen containing plasma, followed by a wet cleanup to remove any organic residue from the top surface of the S/D source dielectric layer (232).

Figure 2E:
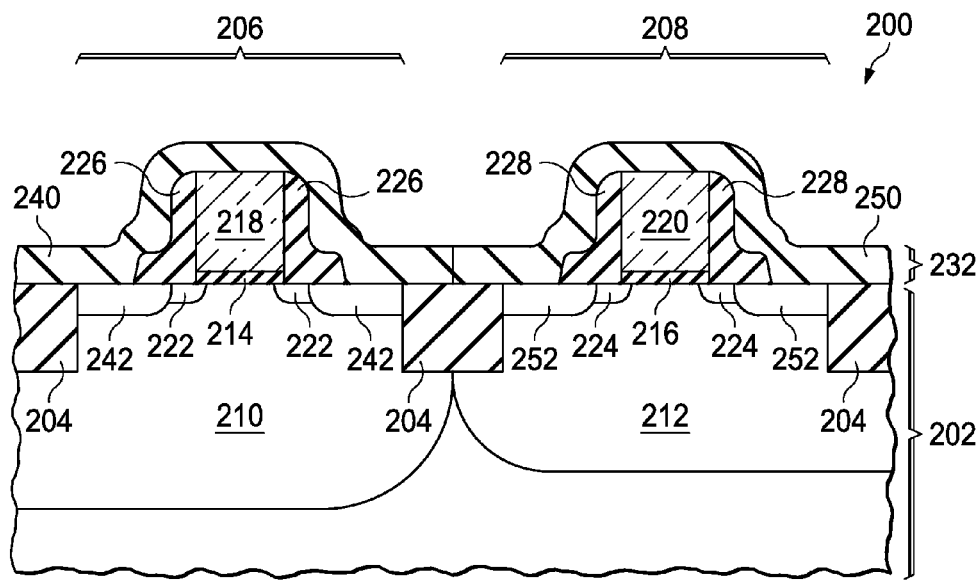

FIG. 2E depicts the IC (200) after a PSD drive process, similar to the NSD drive process, which heats an existing top region of the IC (200) causing the implanted PSD dopant atoms in the PSD implanted region in the top region of the S/D source dielectric layer (232) to diffuse through the S/D source dielectric layer (232) to form a PSD infused region (250) in the S/D source dielectric layer (232) in the PMOS transistor area (208). During the PSD drive process, PSD dopant atoms diffuse out of the PSD infused region (250) into the top region of the n-well (212) to form PSD diffused regions (252) at the top surface of the n-well (212) adjacent to the PMOS gate sidewall spacers (228) in the PMOS transistor area (208). The PSD drive process is preferably a spike anneal process which heats the top surface of the IC (200) to a temperature between 900 C and 1100 C for 1 to 5 seconds, or a laser anneal process which heats the top surface of the IC (200) to a temperature between 1175 C and 1300 C for 100 microseconds to 2 milliseconds. In a preferred embodiment, the PSD diffused regions (252) are between 30 and 100 nanometers deep and contain between $10^{14}$ and $10^{17}$ PSD dopant atoms/cm$^2$. It is within the scope of the instant invention to perform the PSD drive process with any thermal profile in any ambient which produces a desired depth and dopant concentration of the PSD diffused regions (252). In an alternate embodiment, the NSD drive process and the PSD drive process may be performed concurrently.

Figure 3A:
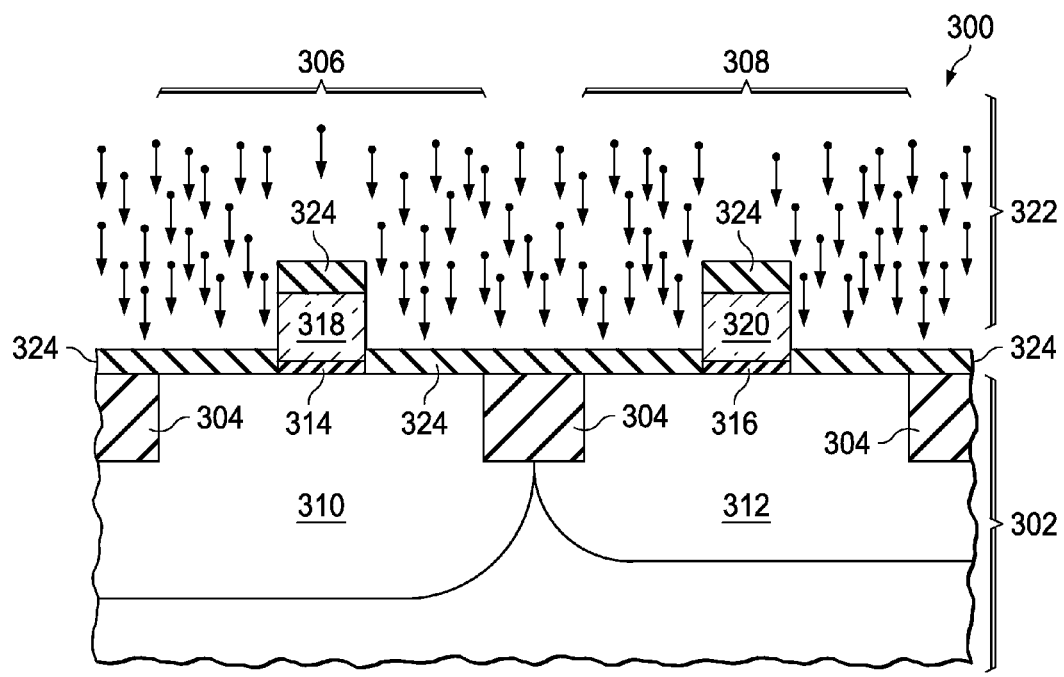
FIG. 3A through FIG. 3C are cross-sections of an IC depicting formation of PLDD regions according to an alternate embodiment of the instant invention, depicted in successive stages of fabrication.
Figure 3B:
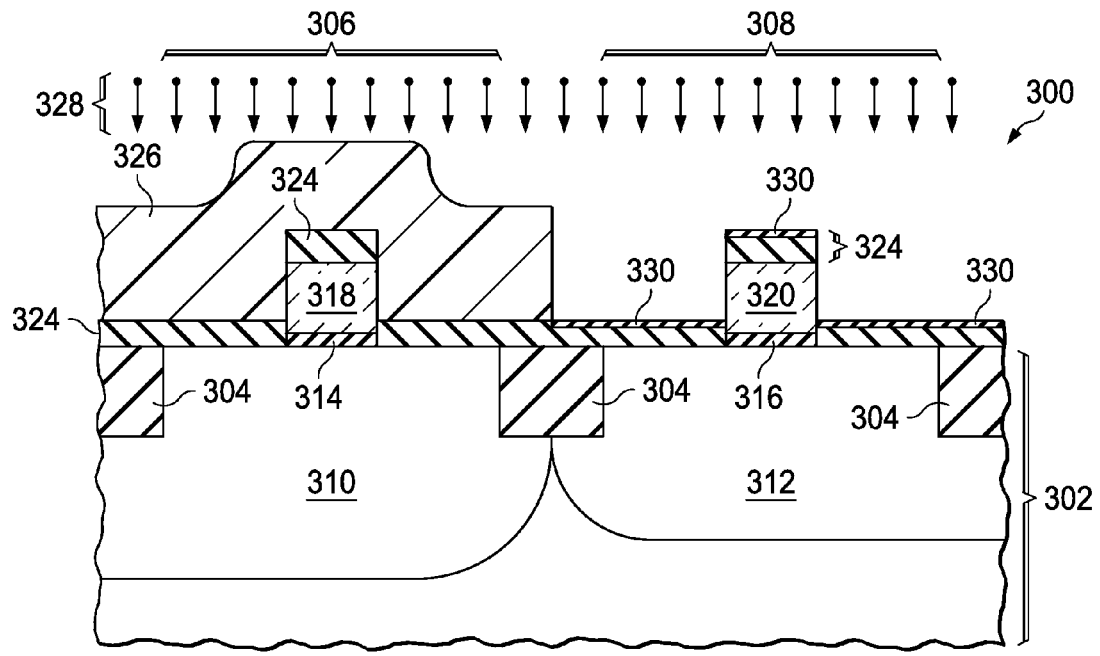
Figure 3C:
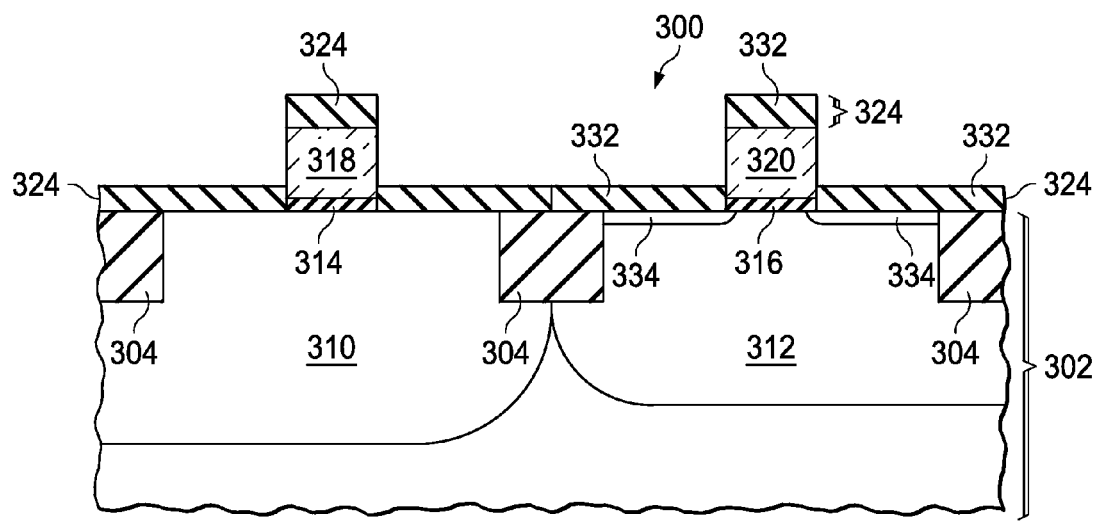

FIG. 3A through FIG. 3C are cross-sections of an IC depicting formation of PLDD regions according to an alternate embodiment of the instant invention, depicted in successive stages of fabrication. Referring to FIG. 3A, the IC (300) is formed in a substrate (302) with the properties described in reference to FIG. 1A. Elements of field oxide (304) are formed in a top region of the substrate (302) by an STI process, such that an element of field oxide (304) separates an area in the substrate (302) defined for an NMOS transistor (306) from an area in the substrate (302) defined for a PMOS transistor (308). A p-well (310) is formed in the substrate (302) in the NMOS area (306), and an n-well (312) is formed in the substrate (302) in the PMOS area (308), as described in reference to FIG. 1A. An NMOS gate dielectric layer (314) is formed on a top surface of the p-well (310), and a PMOS gate dielectric layer (316) is formed on a top surface of the n-well (312), as described in reference to FIG. 1A. An NMOS gate (318) is formed on a top surface of the NMOS gate dielectric layer (314), and a PMOS gate (320)

Continuing to refer to FIG. 3A, an anisotropic LDD source dielectric deposition process (322) is performed on the IC (300) to form an anisotropic LDD source dielectric layer (324) on horizontal surfaces of the p-well (310), n-well (312), NMOS gate (318) and PMOS gate (320). For the purposes of this disclosure, the term "anisotropic layer" is understood to mean a layer which is substantially thinner on vertical surfaces than on horizontal surfaces, or a layer which has substantially no material on vertical surfaces. In one embodiment, depicted in FIG. 3A, substantially no source dielectric material is deposited on vertical surfaces of the NMOS gate (318) and PMOS gate (320). Anisotropic deposition may be achieved by imparting a vertical directionality to reactant species which produce the LDD source dielectric layer (324), for example by accelerating ionized reactant molecules through a vertical electric field or extracting reactant molecules through one or more directional nozzles.

FIG. 3B depicts the IC (300) during a PLDD dopant implantation process. A PLDD photoresist pattern (326) is formed on a top surface of the LDD source dielectric layer (324) such that an area in the PMOS transistor area (308) for implantation of p-type PLDD dopants is exposed. A PLDD set of p-type dopants (328), such as boron, is accelerated toward the IC (300), preferably by a GCIB process but possibly by a molecular ion implantation process or an atomic ion implantation process, to form a PSD implanted region (330) with a dose between $10^{14}$ and $10^{17}$ dopant atoms/cm$^2$ in a top region of the LDD source dielectric layer (324). In the instant embodiment, the PSD implanted region (330) extends nearer to the vertical surfaces of the PMOS gate (320) than in embodiments using conformal source dielectric layers, due to less source dielectric material on the vertical surfaces of the PMOS gate (320) as explained in reference to FIG. 3A. The PLDD photoresist pattern (326) is removed, commonly by exposing the IC (300) to an oxygen containing plasma, followed by a wet cleanup to remove any organic residue from the top surface of the LDD source dielectric layer (324).

FIG. 3C depicts the IC (300) after a PLDD drive process, as described in reference to FIG. 1E, which heats an existing top region of the IC (300) causing the implanted PLDD dopant atoms in the PLDD implanted region in the top region of the LDD source dielectric layer (324) to diffuse through the LDD source dielectric layer (324) to form a PLDD infused region (332) in the LDD source dielectric layer (324) in the PMOS transistor area (308). During the PLDD drive process, PLDD dopant atoms diffuse out of the PLDD infused region (332) into the top region of the n-well (312) to form PLDD diffused regions (334) at the top surface of the n-well (312) adjacent to the PMOS gate (320) in the PMOS transistor area (308). In the instant embodiment, the PLDD diffused regions (334) extend farther toward the PMOS gate (320), and may extend under the PMOS gate dielectric layer (316), compared to embodiments using conformal source dielectric layers, due to the fact observed in reference to FIG. 3B that the PSD implanted region extends nearer to the vertical surfaces of the PMOS gate (320). The further extension of the PLDD diffused regions (334) toward the PMOS gate (320) may be advantageous in some PMOS transistors by increasing on-state drive current.

It will be recognized by those familiar with IC fabrication that the advantages of the instant embodiment may be applied to formation of NLDD diffused regions, PSD diffused region and NSD diffused regions.

It will be recognized by those familiar with IC fabrication that an extension of an LDD region toward or under a gate may be varied by adjusting an amount of source dielectric material deposited on lateral surfaces of the gate. A deposition process for a source dielectric layer may be adjusted from totally conformal to totally anisotropic, advantageously providing a means for providing a desired extension of the LDD region independently of a dose or depth of the LDD region.

What is claimed is:

1. A process of forming an integrated circuit (IC) comprising the steps of:
   forming a source dielectric layer on a top surface of a well region;
   forming an implanted region in an upper portion of said source dielectric layer by a process of implanting an set of dopant atoms into said source dielectric layer such that less than 10 percent of said dopant atoms pass through said source dielectric layer into said well region using a gas cluster ion beam (GCIB) process, a molecular ion implantation process, or an atomic ion implantation process; and
   forming diffused regions of between 5 nm and 20 nm deep by a process of heating said IC such that a portion of said dopant atoms diffuse from said implanted region into top regions of said well using a spike anneal or a laser anneal, wherein said diffused region has an average doping dose above $10^{14}$ cm$^{-2}$.

2. The process of claim 1, in which said source dielectric layer includes silicon dioxide.

3. The process of claim 1, in which said source dielectric layer includes silicon nitride.

4. The process of claim 1, in which said dopant atoms include boron.

5. The process of claim 1, in which said dopant atoms include phosphorus.

6. The process of claim 1, in which said dopant atoms include arsenic.

7. The process of claim 1, in which said step of implanting a set of dopant atoms is performed using a gas cluster ion beam (GCIB) process.

8. The process of claim 1, in which said step of implanting a set of dopant atoms is performed using a molecular ion implantation process.

9. The process of claim 1, in which said step of implanting a set of dopant atoms is performed using an atomic ion implantation process.

10. The process of claim 1, in which said process of heating said IC includes heating a top region of said IC between 900° C. and 1100° C. for 1 to 5 seconds.

11. The process of claim 1, in which said process of heating said IC includes heating a top region of said IC between 1175° C. and 1300° C. for 100 microseconds to 2 milliseconds.

12. The process of claim 1, wherein the diffused region is a lightly doped drain region.

13. The process of claim 1, wherein the diffused region is a source and drain region.

* * * * *